US009490117B2

(12) United States Patent
Park et al.

(10) Patent No.: US 9,490,117 B2
(45) Date of Patent: Nov. 8, 2016

(54) DIRECTED SELF-ASSEMBLY PATTERN FORMATION METHODS AND COMPOSITIONS

(71) Applicants: Rohm and Haas Electronic Materials LLC, Marlborough, MA (US); Dow Global Technologies LLC, Midland, MI (US)

(72) Inventors: Jong Keun Park, Marlborough, MA (US); Jibin Sun, Menlo Park, CA (US); Christopher D. Gilmore, Marlborough, MA (US); Jieqian Zhang, Marlborough, MA (US); Phillip D. Hustad, Marlborough, MA (US); Peter Trefonas, III, Marlborough, MA (US); Kathleen M. O'Connell, Seoul (KR)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/588,410

(22) Filed: Dec. 31, 2014

(65) Prior Publication Data

US 2015/0287592 A1  Oct. 8, 2015

Related U.S. Application Data

(60) Provisional application No. 61/922,767, filed on Dec. 31, 2013.

(51) Int. Cl.
| | | |
|---|---|---|
| G03F 7/004 | (2006.01) | |
| H01L 21/02 | (2006.01) | |
| H01L 21/027 | (2006.01) | |
| G03F 7/00 | (2006.01) | |
| G03F 7/20 | (2006.01) | |
| G03F 7/38 | (2006.01) | |
| G03F 7/40 | (2006.01) | |
| C08F 220/18 | (2006.01) | |
| C08F 12/32 | (2006.01) | |
| C08F 212/32 | (2006.01) | |
| C08F 212/08 | (2006.01) | |
| H01L 21/311 | (2006.01) | |
| C08F 220/30 | (2006.01) | |

(52) U.S. Cl.
CPC ......... H01L 21/02255 (2013.01); C08F 12/32 (2013.01); C08F 212/08 (2013.01); C08F212/32 (2013.01); C08F 220/18 (2013.01); G03F 7/0002 (2013.01); G03F 7/004 (2013.01); G03F 7/20 (2013.01); G03F 7/38 (2013.01); G03F 7/40 (2013.01); H01L 21/0274 (2013.01); H01L 21/02118 (2013.01); H01L 21/311 (2013.01); *C08F 2220/302* (2013.01)

(58) Field of Classification Search
CPC ...... G03F 7/0002; G03F 7/0004; G03F 7/20; G03F 7/38; G03F 7/40; C08F 12/32; C08F 212/32; C08F 212/08; C08F 220/18; C08F 2220/302; H01L 21/311; H01L 21/02118; H01L 21/02255; H01L 21/0274
USPC ............ 430/270.1, 322, 325, 329, 330, 331; 438/702, 781; 524/553
See application file for complete search history.

(56) References Cited

U.S. PATENT DOCUMENTS

| | | | | |
|---|---|---|---|---|
| 4,540,763 | A * | 9/1985 | Kirchhoff | ............... C07C 2/861 526/281 |
| 4,661,193 | A * | 4/1987 | Kirchhoff | ............... C07C 13/44 156/307.3 |
| 4,698,394 | A * | 10/1987 | Wong | .................... C08F 212/04 525/289 |
| 4,965,329 | A | 10/1990 | Kirchhoff | |
| 5,198,527 | A * | 3/1993 | Marks | .................... C08G 64/14 525/462 |
| 5,318,827 | A * | 6/1994 | Logan | ..................... C08J 7/047 428/2 |
| 6,593,490 | B1 * | 7/2003 | Li | ............................ C08J 3/246 560/130 |
| 6,780,567 | B2 | 8/2004 | Makino et al. | |
| 6,884,848 | B2 * | 4/2005 | Li | ............................ C08J 3/246 525/199 |
| 7,598,114 | B2 * | 10/2009 | Li | ....................... H01L 21/7682 257/E25.008 |
| 8,940,810 | B2 * | 1/2015 | Ogawa | .................... C08F 12/32 520/1 |
| 9,125,541 | B2 * | 9/2015 | Forster | .................... A47L 15/23 |
| 9,209,067 | B2 * | 12/2015 | Park | .................. H01L 21/76224 |
| 2010/0316849 | A1 | 12/2010 | Millward et al. | |
| 2012/0088188 | A1 | 4/2012 | Trefonas et al. | |
| 2013/0078576 | A1 * | 3/2013 | Wu | ....................... C08F 293/00 430/296 |
| 2013/0224635 | A1 | 8/2013 | Takekawa et al. | |
| 2013/0273330 | A1 | 10/2013 | Wang et al. | |
| 2013/0284698 | A1 | 10/2013 | Ogihara | |
| 2015/0210793 | A1 * | 7/2015 | Park | ....................... C08F 212/12 524/553 |

FOREIGN PATENT DOCUMENTS

WO  2013005026 A2  1/2013

OTHER PUBLICATIONS

Baker "Synthesis of Functional Vinylbenzocyclobutenes for Use as Crosslinkers in the Preparation of Amphiphilic Nanoparticles", Dissertation, University of Akron, Dec. 2011.*
Liu et al, "Fabrication of lithographically defined chemically patterned polymer brushes and mats", Macromolecules, ACS Publications, 2011, vol. 44, pp. 1876-1885.
Ryu, et al, "A generalized approach to the modification of solid surfaces", Science, vol. 308, Apr. 8, 2005, pp. 236-239.
Pugh, et al, "Setyternthesis of a polymerizable benzocyclobutene that undergoes ring-opening isomerization at reduced temperature", Synlett, vol. 25, pp. 148-152, (2013).
Yang, et al, "Recent progress in benzocyclobutene related polymers", InTech, 2012, Chap. 9, pp. 201-222.
Search report for corresponding Taiwan Application No. 1031146518, dated Nov. 19, 2015.
Baker, et al, Cross-linking agents based on functionalized vinylbenzocyclobutenes, Polymer Preprints, 2012, vol. 53, No. 1, pp. 121.
Search report for corresponding Chinese Application No. 201410858452.3 dated Jun. 14, 2016.

* cited by examiner

*Primary Examiner* — Amanda C Walke
(74) *Attorney, Agent, or Firm* — Jonathan D. Baskin

(57) ABSTRACT

A method of forming a pattern by directed self-assembly, comprising: (a) providing a semiconductor substrate comprising one or more layers to be patterned; (b) applying a crosslinkable underlayer composition over the one or more layers to be patterned to form a crosslinkable underlayer, wherein the crosslinkable underlayer composition comprises a crosslinkable polymer comprising a first unit formed from a monomer of the following general formula (I-A) or (I-B):

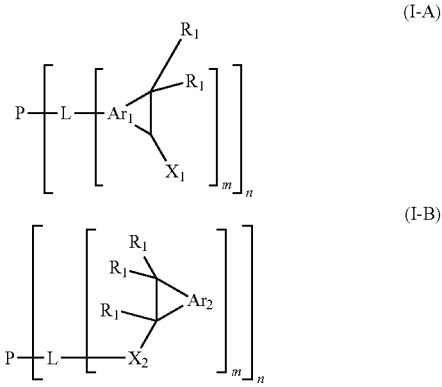

wherein: P is a polymerizable functional group; L is a single bond or an m+1-valent linking group; $X_1$ is a monovalent electron donating group; $X_2$ is a divalent electron donating group; $Ar_1$ and $Ar_2$ are trivalent and divalent aryl groups, respectively, and carbon atoms of the cyclobutene ring are bonded to adjacent carbon atoms on the same aromatic ring of $Ar_1$ or $Ar_2$; m and n are each an integer of 1 or more; and each $R_1$ is independently a monovalent group; (c) heating the crosslinkable underlayer to form a crosslinked underlayer; (d) forming a self-assembling layer comprising a block copolymer over the crosslinked underlayer; and (e) annealing the self-assembling layer. The methods and compositions find particular applicability in the manufacture of semiconductor devices or data storage devices for the formation of high resolution patterns.

9 Claims, 2 Drawing Sheets

DIRECTED SELF-ASSEMBLY PATTERN FORMATION METHODS AND COMPOSITIONS

This application claims the benefit of priority under 35 U.S.C. §119(e) to U.S. Provisional Application No. 61/922,767, filed Dec. 31, 2013, the entire contents of which are incorporated herein by reference.

FIELD

The invention relates generally to the manufacture of electronic devices. More specifically, this invention relates to methods of forming patterns by directed self-assembly and to underlayer compositions for use in such methods. The methods and compositions have applicability, for example, to semiconductor device manufacturing for the formation of fine patterns, or for data storage such as hard drive manufacture.

INTRODUCTION

In the semiconductor manufacturing industry, optical lithography with photoresist materials has been the standard for transferring an image to one or more underlying layers, such as metal, semiconductor and dielectric layers, disposed on a semiconductor substrate, and to the substrate itself. To increase the integration density of semiconductor devices and allow for the formation of structures having dimensions in the nanometer range, photoresists and photolithography processing tools having high-resolution capabilities have been developed. The current manufacturing standard for advanced optical lithography is 193 nm immersion lithography. The physical resolution limit of this process, however, makes it difficult to directly create patterns beyond about 36 nm half-pitch line and space patterns. While EUV optical exposure tools are being developed for creating higher resolution patterns, the cost of such tools is prohibitive and adoption of the technology remains uncertain.

Directed self-assembly (DSA) processes have been proposed to extend the resolution limits beyond those of current optical lithography techniques, for example, to less than 15 nm. The DSA process relies on the ability of certain types of block copolymers to rearrange upon annealing into ordered structures on the substrate surface. This rearrangement of the block copolymers is based on the affinity of one of the blocks to a pre-pattern on the underlying surface.

Known crosslinkable polymer systems for use in DSA underlayers include random copolymers comprising vinyl benzocyclobutene (BCB) and styrene. Such a polymer is disclosed, for example, in Du Yeol Ryu et al, "A Generalized Approach to the Modification of Solid Surfaces," Science 308, 236 (2005). Widespread use in DSA underlayers of polymers containing vinyl BCB, however, is limited by the requirement of a relatively high annealing temperature (e.g., about 250° C.) and/or long annealing time to induce crosslinking by isomerization of the cyclobutene ring to the reactive o-quinodimethane intermediate. The use of high crosslinking temperatures can adversely impact underlying layers including, for example, antireflective coating and hardmask layers by causing thermal degradation and/or oxidation of those layers. The high crosslinking temperatures can further give rise to dewetting, resulting in poor pattern formation, and to oxidation-induced surface energy changes. In addition, a higher crosslinking temperature would limit the types of functional monomers that could otherwise be used in a DSA underlayer layer composition. High crosslinking temperatures are also disadvantageous in that a more complicated heating tool may be required to process the substrates to provide an inert gas environment to prevent unwanted oxidation that could results in an increase in surface energy of the underlayer. It would, therefore, be desirable to have DSA processes that would allow for low-temperature crosslinking of an underlayer composition in a reasonably short period of time, as well as crosslinkable polymers and underlayer compositions for use in the processes.

There is a continuing need for directed self-assembly processes, and for crosslinkable polymers and DSA underlayer compositions containing such polymers, that address one or more problems associated with the state of the art.

SUMMARY

In accordance with a first aspect of the invention, methods of forming a pattern by directed self-assembly are provided. The methods comprise: (a) providing a semiconductor substrate comprising one or more layers to be patterned; (b) applying a crosslinkable underlayer composition over the one or more layers to be patterned to form a crosslinkable underlayer, wherein the crosslinkable underlayer composition comprises a crosslinkable polymer comprising a first unit formed from a monomer of the following general formula (I-A) or (I-B):

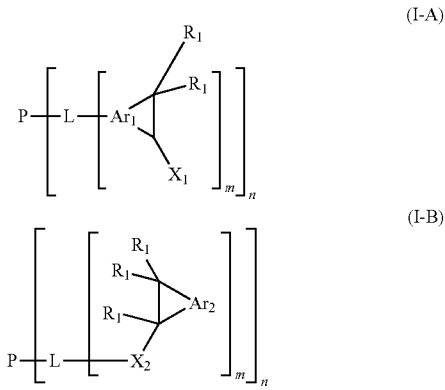

wherein: P is a polymerizable functional group; L is a single bond or an m+1-valent linking group; $X_1$ is a monovalent electron donating group; $X_2$ is a divalent electron donating group; $Ar_1$ and $Ar_2$ are trivalent and divalent aryl groups, respectively, and carbon atoms of the cyclobutene ring are bonded to adjacent carbon atoms on the same aromatic ring of $Ar_1$ or $Ar_2$; m and n are each an integer of 1 or more; and each $R_1$ is independently a monovalent group; (c) heating the crosslinkable underlayer to form a crosslinked underlayer; (d) forming a self-assembling layer comprising a block copolymer over the crosslinked underlayer; and (e) annealing the self-assembling layer. The methods find particular applicability in the manufacture of semiconductor devices for the formation of high resolution patterns.

The terminology used herein is for the purpose of describing particular embodiments only and is not intended to be limiting of the invention. As used herein, the singular forms "a", "an" and "the" are intended to include the plural forms as well, unless the context clearly indicates otherwise. Unit ratios when used for polymers are in mole % unless otherwise indicated.

BRIEF DESCRIPTION OF THE DRAWINGS

The present invention will be described with reference to the following drawings, in which like reference numerals denote like features, and in which.

DETAILED DESCRIPTION

Figure 1A:
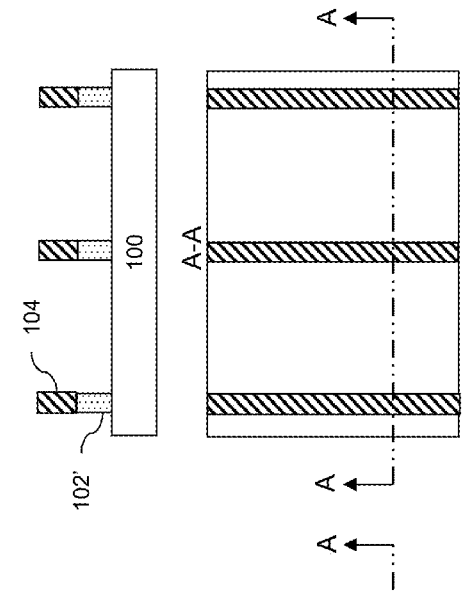
FIG. 1A-F illustrates with cross-sectional and top-down views an exemplary DSA process flow in accordance with the invention.

The directed self-assembly (DSA) methods of the invention involve application of a crosslinkable underlayer composition over one or more layers to be patterned. The crosslinkable underlayer composition includes a crosslinkable polymer, a solvent and can include one or more additional optional components.

Crosslinkable polymers useful in the compositions can be homopolymers or can be copolymers having a plurality of distinct repeat units, for example, two, three, four or more distinct repeat units. Typically, the crosslinkable polymer is a copolymer. The copolymer can be a random copolymer, a block copolymer or a gradient copolymer, with a random copolymer being typical.

The crosslinkable polymer comprises a first unit that includes an aromatic group fused to a cyclobutene ring, hereafter an "arylcyclobutene". The aromatic group can include a single or plural aromatic rings, for example, one, two, three, four or more aromatic rings. Where plural aromatic rings are present in the unit, the aromatic rings can themselves form a fused (e.g., naphthyl, anthracenyl, pyrenyl) and/or tethered (e.g., biphenyl) structure. The aromatic group is optionally substituted, for example, with one or more of alkyl, cycloalkyl or halo. The cyclobutene group is optionally substituted, for example, with one or more of hydroxy, alkoxy, amine or amide.

The crosslinkable polymer includes a unit formed from a monomer of the following general formula (I-A) or (I-B):

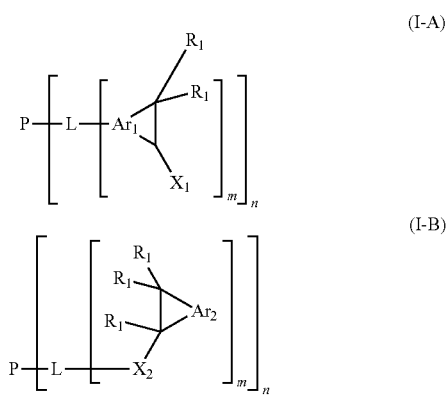

wherein: P is a polymerizable functional group, for example, vinyl, (alkyl)acrylate or cyclic olefin; L is a single bond or an m+1-valent linking group chosen from optionally substituted linear or branched aliphatic and aromatic hydrocarbons, and combinations thereof, optionally with one or more linking moiety chosen, for example, from —O—, —S—, —COO—, —CONR$_3$—, —CONH— and —OCONH—, wherein R$_3$ is chosen from hydrogen and substituted and unsubstituted C$_1$ to C$_{10}$ linear, branched and cyclic hydrocarbons, preferably alkyl; X$_1$ is chosen from monovalent electron donating groups, for example, C$_1$-C$_{10}$ alkoxy, amine, sulfur, —OCOR$_9$, wherein R$_9$ is chosen from substituted and unsubstituted C$_1$ to C$_{10}$ linear, branched and cyclic hydrocarbons, —NHCOR$_{10}$, wherein R$_{10}$ is chosen from substituted and unsubstituted C$_1$ to C$_{10}$ linear, branched and cyclic hydrocarbons; X$_2$ is chosen from a divalent electron donating group, for example, —O—, —S—, —COO—, —CONR$_{11}$—, —CONH— and —OCONH—, wherein R$_{11}$ is chosen from hydrogen and substituted and unsubstituted C$_1$ to C$_{10}$ linear, branched and cyclic hydrocarbons, preferably alkyl, preferably —O—; Ar$_1$ and Ar$_2$ are, respectively, trivalent and divalent aryl groups, and the carbon atoms of the cyclobutene ring are bonded to adjacent carbon atoms on the same aromatic ring of Ar$_1$ or Ar$_2$; and m and n are each an integer of 1 or more; each R$_1$ is independently a monovalent group. Preferably, Ar$_1$ and Ar$_2$ include 1, 2 or 3 aromatic carbocyclic or heteroaromatic rings. It is preferred that the aryl group comprises a single aromatic ring, and more preferably a phenyl ring. The aryl group is optionally substituted with 1 to 3 groups chosen from (C$_1$-C$_6$)alkyl, (C$_1$-C$_6$)alkoxy, and halo, preferably with one or more of (C$_1$-C$_6$)alkyl, (C$_1$-C$_3$)alkoxy, and chloro, and more preferably with one or more of (C$_1$-C$_3$)alkyl and (C$_1$-C$_3$)alkoxy. It is preferred that the aryl group is unsubstituted. It is preferred that m=1 or 2, and more preferably m=1. It is preferred that n=1-4, more preferably n=1 or 2, and yet more preferably n=1. Preferably, R$_1$ is chosen from H and (C$_1$-C$_6$)alkyl, and more preferably from H and (C$_1$-C$_3$)alkyl. Preferably, R$_2$ is chosen from a single bond, (C$_1$-C$_6$)alkylene, and more preferably from a single bond and (C$_1$-C$_3$)alkylene. For clarity, where m or n are greater than 1, each of the various groups defined in formulas (I-A) and (I-B) where multiple such groups are present can be independently chosen.

The polymerizable functional group P can be chosen, for example, from the following general formulae (II-A) and (II-B):

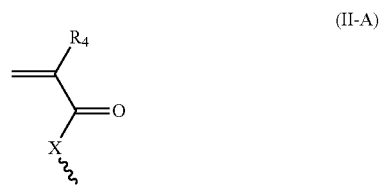

wherein R$_4$ is chosen from hydrogen, fluorine, C$_1$-C$_3$ alkyl and C$_1$-C$_3$ fluoroalkyl; and X is oxygen or is represented by the formula NR$_5$, wherein R$_5$ is chosen from hydrogen and substituted and unsubstituted C$_1$ to C$_{10}$ linear, branched and cyclic hydrocarbons; and

wherein R$_6$ is chosen from hydrogen, fluorine, C$_1$-C$_3$ alkyl and C$_1$-C$_3$ fluoroalkyl. Additional suitable polymerizable functional groups include, for example, norbornenes, cyclic siloxanes, cyclic ethers, alkoxysilanes, novolacs, functional groups such as phenols and/or aldehydes, carboxylic acids, alcohols and amines.

Arylcyclobutene monomers useful in the invention can be prepared by any suitable means, such as those described in M. Azadi-Ardakani et al, *3,6-Dimethoxybenzocyclobutenone: A Reagent for Quinone Synthesis, Tetrahedron*, Vol. 44, No. 18, pp. 5939-5952, 1988; J. Dobish et al, *Polym. Chem.*, 2012, 3, 857-860 (2012); U.S. Pat. Nos. 4,540,763, 4,812,588, 5,136,069 and 5,138,081; and International Pat. App. Pub. No. WO 94/25903. Arylcyclobutenes useful in making the monomers are commercially available under the Cyclotene™ brand, available from The Dow Chemical Company.

Suitable arylcyclobutene monomers include, for example, the following:

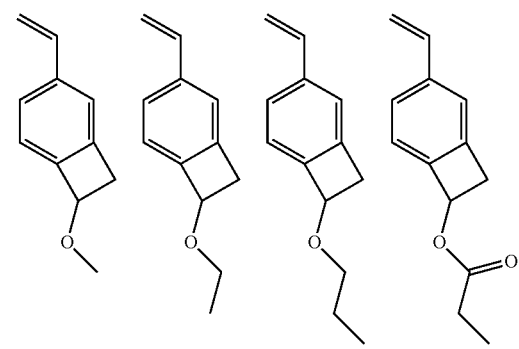
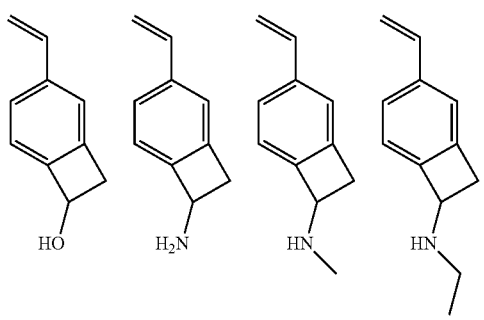
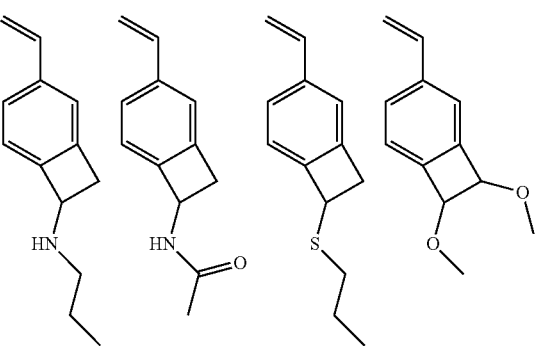
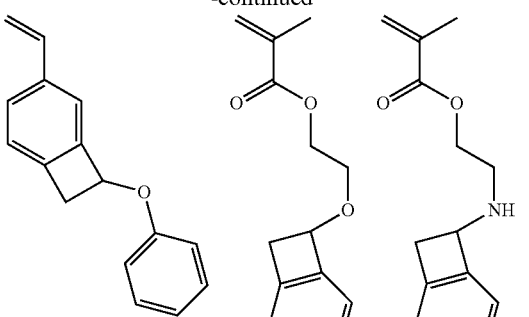
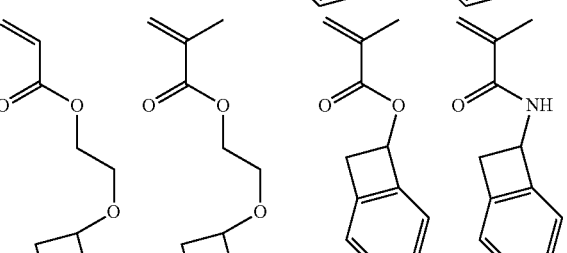
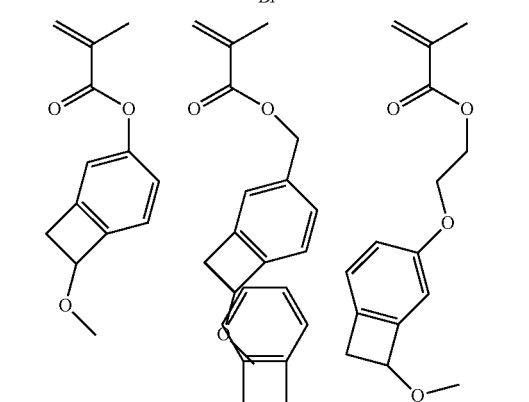
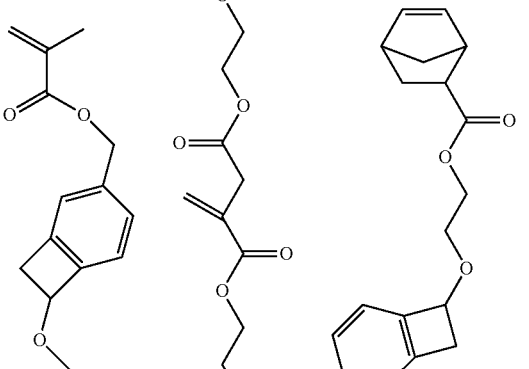

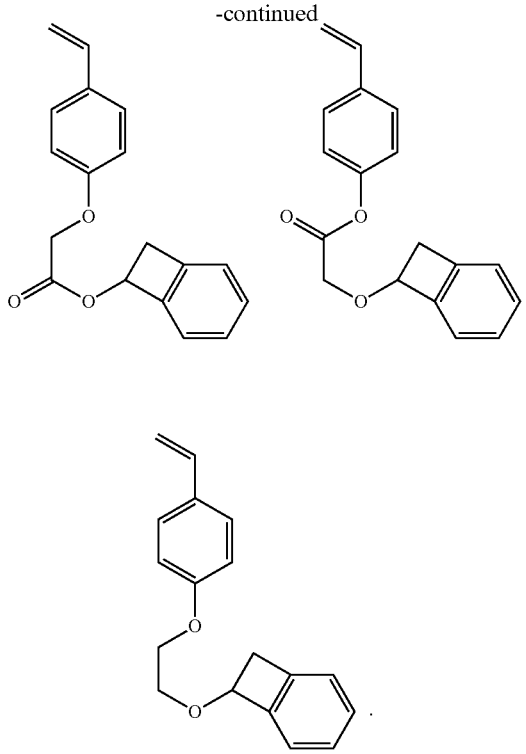

The first unit is typically present in the self-crosslinkable polymer in an amount of from 1 to 100 mol %, for example, from 1 to 50 mol %, from 2 to 20 mol %, or from 3 to 10 mol %, based on the polymer.

The crosslinkable polymer can include one or more additional units. The polymer can, for example, include one or more additional units for purposes of tuning surface energy, optical properties (e.g., n and k values) and/or glass transition temperature of the self-crosslinkable polymer. By selection of appropriate units for the polymer, the polymer can be made to have affinity for a particular block of a DSA block copolymer to be coated on the underlayer, or to be neutral to each block of the DSA block copolymer. Suitable units include, for example, one or more units chosen from the following general formulae (III) and (IV):

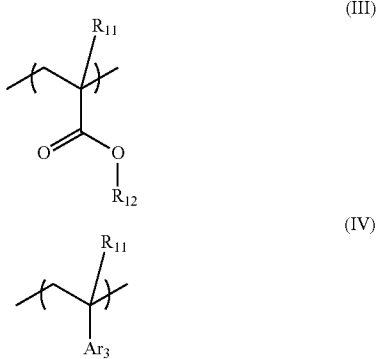

wherein $R_{11}$ is independently chosen from hydrogen, fluorine, $C_1$-$C_3$ alkyl and $C_1$-$C_3$ fluoroalkyl, $R_{12}$ is chosen from optionally substituted $C_1$ to $C_{10}$ alkyl; and $Ar_3$ is an aryl group. Preferably, $Ar_3$ includes 1, 2 or 3 aromatic carbocyclic and/or heteroaromatic rings. It is preferred that the aryl group comprises a single aromatic ring, and more preferably a phenyl ring. The aryl group is optionally substituted with, for example, ($C_1$-$C_6$)alkyl, ($C_1$-$C_6$)alkoxy or halo. It is preferred that the aryl group is unsubstituted.

Exemplary suitable structures for the additional units include the following:

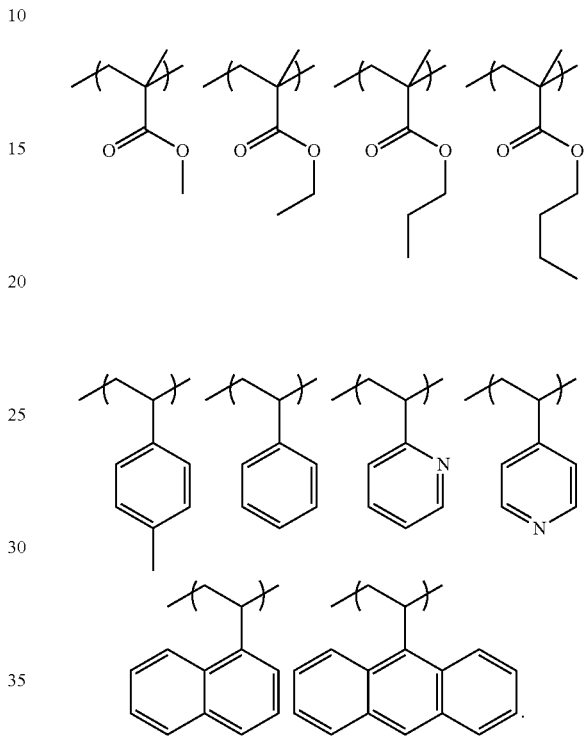

The one or more additional units if present in the self-crosslinkable polymer can be used in an amount of up to 99 mol %, preferably from 80 to 98 mol % based on the polymer.

The crosslinkable polymer preferably has a weight average molecular weight Mw of less than 100,000, preferably, a Mw of 1,000 to 50,000. The crosslinkable polymer typically has a polydispersity index (PDI=Mw/Mn) of less than 2.0, and more preferably less than 1.8. Molecular weight, both Mw and Mn, can be determined by, for example, gel permeation chromatography using a universal calibration method, and calibrated to polystyrene standards.

Preferably, the onset temperature ($T_o$) for crosslinking of the polymer is less then 250° C., preferably from 100 to 225° C., more preferably from 100 to 200° C. Such a relatively low onset temperature will allow for crosslinking of the polymer at a relatively low temperature and time, thereby avoiding or minimizing problems such as those described above that may occur with the use of polymers having higher onset and crosslinking temperatures.

The crosslinkable polymer is typically present in the underlayer composition in an amount of from 80 to 100 wt %, for example, from 90 to 100 wt % or from 95 to 100 wt %, based on total solids of the composition.

Suitable random crosslinkable polymers include, for example, the following (ratios in mole %):

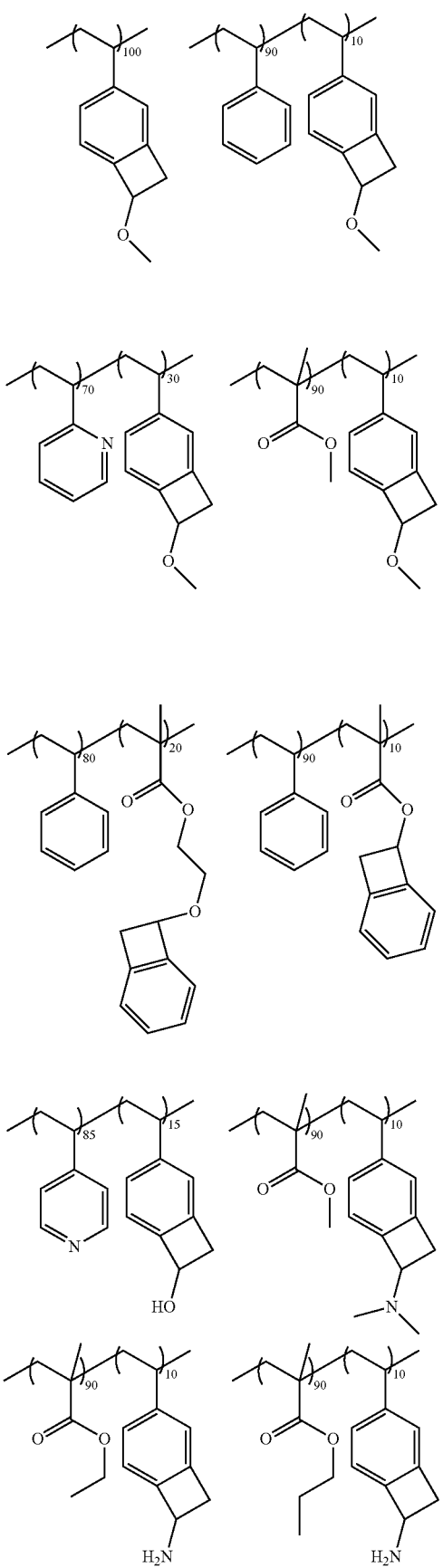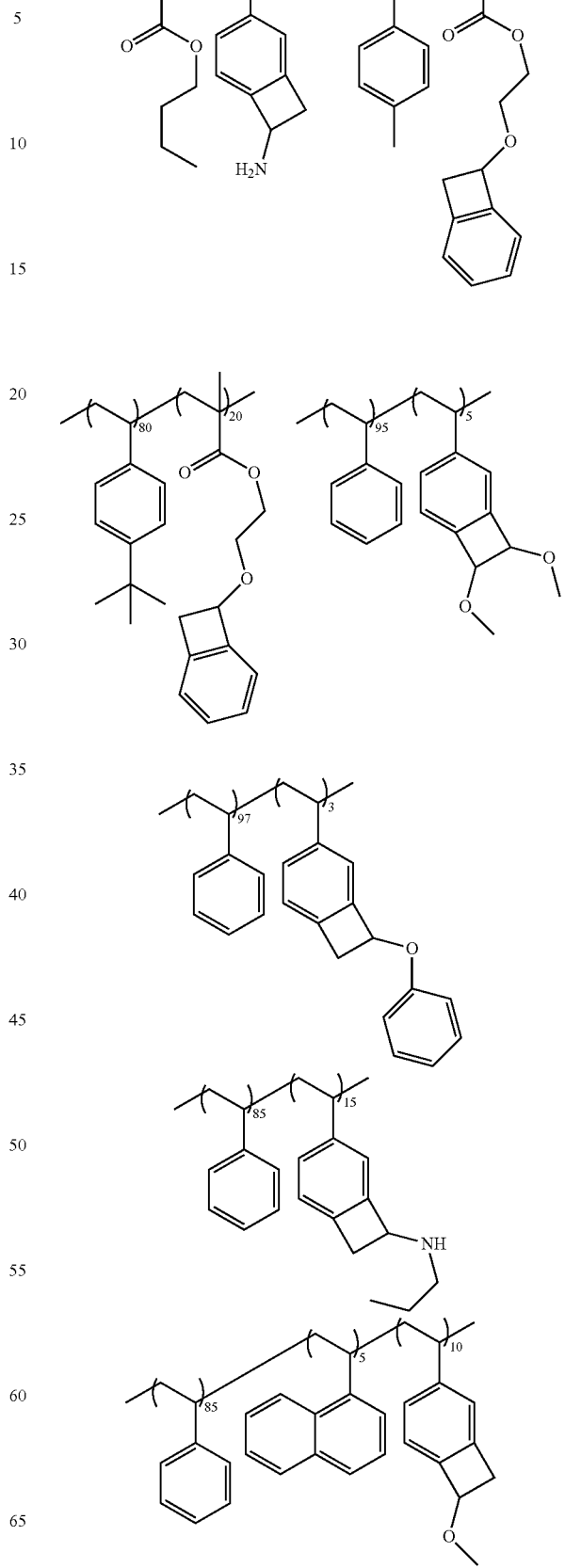

-continued

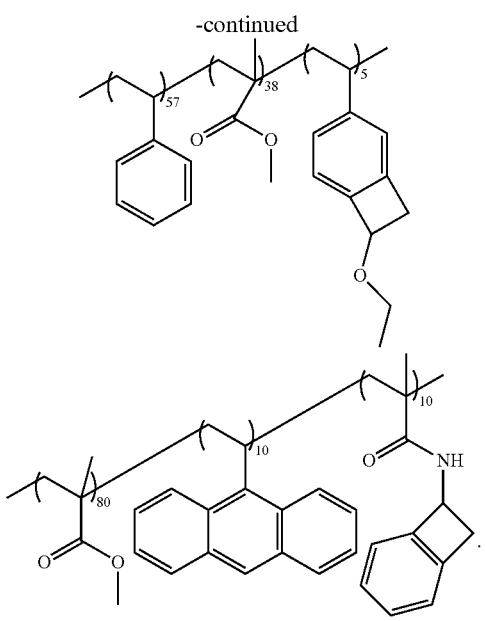

wherein unit ratios are in mole % based on the polymer.

The underlayer composition further includes a solvent which can include a single solvent or a solvent mixture. Suitable solvent materials to formulate and cast the underlayer composition exhibit very good solubility characteristics with respect to the non-solvent components of the composition, but do not appreciably dissolve the underlying materials of the substrate surface coming into contact with the underlayer composition. The solvent is typically chosen from water, aqueous solutions, organic solvents and mixtures thereof. Suitable organic solvents for the underlayer composition include, for example: alcohols such as straight, branched or cyclic $C_4$-$C_9$ monohydric alcohol such as 1-butanol, 2-butanol, isobutyl alcohol, tert-butyl alcohol, 2-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; alkyl esters such as alkyl acetates such as n-butyl acetate, propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; ethers such as isopentyl ether and dipropylene glycol monomethyl ether; and mixtures containing one or more of these solvents. Of these organic solvents, alcohols, aliphatic hydrocarbons and ethers are preferred. The solvent component of the composition is typically present in an amount of from 80 to 99 wt %, more typically, from 90 to 99 wt % or from 95 to 99 wt %, based on the total weight of the underlayer composition.

The underlayer composition may include one or more optional additives including, for example, surfactants and antioxidants. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO copolymers PLURONIC® 25R2, L121, L123, L31, L81, L101 and P123 (BASF, Inc.). Such surfactant and other optional additives if used are typically present in the composition in minor amounts such as from 0.01 to 10 wt % based on total solids of the underlayer composition.

An antioxidant can be added to the underlayer composition to prevent or minimize oxidation of organic materials in the underlayer composition. Suitable antioxidants include, for example, phenol-based antioxidants, antioxidants composed of an organic acid derivative, sulfur-containing antioxidants, phosphorus-based antioxidants, amine-based antioxidants, antioxidants composed of an amine-aldehyde condensate and antioxidants composed of an amine-ketone condensate. Examples of phenol-based antioxidants include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butylhydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butylanilino)2,4-bis-octyl-thio-1,3,5-triazine, n-octadecyl-3-(4'-hydroxy-3',5'-di-tert-butylphenyl)propionate, octylated phenol, aralkyl-substituted phenols, alkylated p-cresol and hindered phenol; bis-, tris- and poly-phenols such as 4,4'-dihydroxydiphenyl, methylene-bis(dimethyl-4,6-phenol), 2,2'-methylene-bis-(4-methyl-6-tert-butylphenol), 2,2'-methylene-bis-(4-methyl-6-cyclohexylphenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyldiphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane. Suitable antioxidants are commercially available, for example, Irganox™ antioxidants (Ciba Specialty Chemicals Corp.).

The antioxidants if used are typically present in the underlayer composition in an amount of from 0.01 to 10 wt % based on total solids of the underlayer composition.

As the polymer is self-crosslinkable, the underlayer composition does not require an additive crosslinking agent to effect crosslinking of the polymer. Preferably, the underlayer composition is free of such additive crosslinking agents.

The underlayer compositions can be prepared following known procedures. For example, the compositions can be prepared by dissolving the solid components of the composition in the solvent components. The desired total solids content of the compositions will depend on factors such as the desired final layer thickness. Typically, the solids content of the underlayer compositions is from 0.05 to 10 wt %, more typically, from 0.1 to 5 wt %, based on the total weight of the composition.

The underlayer compositions may be subjected to purification steps prior to being disposed on the substrate. Purification may involve, for example, centrifugation, filtration, distillation, decantation, evaporation, treatment with ion exchange beads, and the like.

The underlayer compositions of the invention find particular use in DSA processes as an underlayer having affinity to a block of an overcoated DSA block copolymer, or which is neutral to the blocks of the DSA block copolymer. The compositions can, for example, be used in chemical epitaxy (chemoepitaxy) processes requiring the use of such an underlayer.

For purposes of illustration, the invention will now be described with reference to FIG. 1A-F which depicts an exemplary DSA chemoepitaxy process flow in accordance with the invention. While the exemplified process of FIG. 1 employs the underlayer composition of the invention as a mat layer, it should be clear that it may alternatively be used in forming a brush layer or other type of underlayer.

FIG. 1A depicts a substrate 100 which includes one or more layer to be patterned on a surface thereof. The one or more layer to be patterned can be the underlying base substrate material itself and/or one or more layers distinct from and formed over the base substrate material. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. The layers on the substrate may include, for example, one or more conductive layers such as layers of aluminum, copper, molybdenum, tantalum, titanium, tungsten, alloys, nitrides or silicides of such metals, doped amorphous silicon or doped polysilicon, amorphous carbon, one or more dielectric layers such as layers of silicon oxide, silicon nitride, silicon oxynitride, or metal oxides, semiconductor layers, such as single-crystal silicon, and combinations thereof. The layers can include a hard mask layer, such as a silicon-containing or carbon hardmask layer, or an antireflective coating layer such as a bottom antireflective coating (BARC) layer. The layers can be formed by various techniques, for example, chemical vapor deposition (CVD) such as plasma-enhanced CVD, low-pressure CVD or epitaxial growth, physical vapor deposition (PVD) such as sputtering or evaporation, electroplating or by spin coating.

An underlayer composition as described herein is applied to the substrate surface to form an underlayer 102. The underlayer composition can be applied to the substrate, for example, by spin-coating, dipping, roller-coating or other conventional coating technique. Of these, spin-coating is typical and preferred. For spin-coating, the solids content of the underlayer composition can be adjusted to provide a desired film thickness based upon the specific coating equipment utilized, the viscosity of the solution, the spin speed of the coating tool and the amount of time allowed for spinning. A typical thickness for the underlayer composition is from 2 to 15 nm, preferably from 5 to 10 nm.

Optionally, the underlayer 102 can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 120 seconds.

The underlayer composition layer 102 is heated at a temperature and time effective to cause the crosslinkable polymer to crosslink to form a crosslinked polymer network. The crosslinking bake can be conducted on a hotplate or in an oven. The crosslinking bake can, for example, be conducted on a hotplate of a wafer track also used for coating of the underlayer composition. The crosslinking bake temperature and time will depend, for example, on the particular composition and thickness of the underlayer. The crosslinking bake is typically conducted at a temperature of from about 100 to 250° C., and a time of from about 30 seconds to 30 minutes, preferably from 30 seconds to 5 minutes, more preferably from 30 to 120 seconds. The crosslinking bake can be conducted, for example, by heating the underlayer at a single temperature, ramping the temperature during the bake or using a terraced heating profile. Because the crosslinking reaction can be conducted at a relatively low temperature, the bake can be conducted in an air ambient, although it can optionally be conducted under another atmosphere such as inert gas.

Figure 1B:
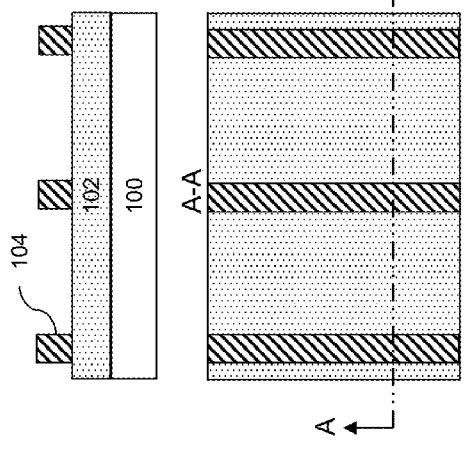
Figure 1C:
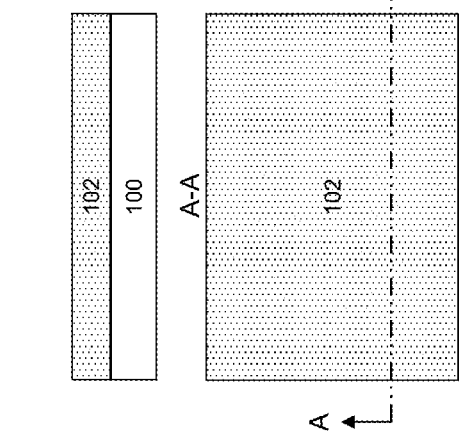

The crosslinked underlayer layer is next patterned to form guide patterns. Patterning of the guide patterns can be accomplished using photolithography and etching processes as illustrated in FIGS. 1B and 1C. The patterning can alternatively be accomplished chemically, for example, by acid-catalyzed polarity switching of regions of the underlayer corresponding to the guide patterns, or of the regions not corresponding to the guide patterns. Suitable polarity switching processes and compositions are described in U.S. App. Pub. No. US2012/0088188A1.

The patterning is typically accomplished through a photolithographic process by which a photoresist composition is coated over the crosslinked underlayer, and softbaked to remove the solvent from the layer. The photoresist layer is typically coated to a thickness of from 50 nm to 120 nm. Suitable photoresist materials are known in the art and/or are commercially available. The photoresist layer is patternwise exposed to activating radiation through a patterned photomask and the image is developed with a suitable developer, for example, an aqueous base (e.g., 2.38 wt % TMAH) or organic solvent developer. The photoresist is typically chemically amplified and can be imaged with short wavelength radiation (e.g., sub-200 nm radiation including 193 nm and EUV radiation (e.g., 13.5 nm)), or by electron beam. The photoresist can be positive- or negative-acting. It may be desirable that the resist pattern be formed by negative tone development (NTD) by which a traditionally positive-type photoresist is imaged and developed in an organic solvent developer. The resulting photoresist pattern 104 is formed over the crosslinked underlayer 102, as shown in FIG. 1B.

The photoresist pattern 104 is next transferred to the underlayer 102 by etching to form guide patterns 102' separated by openings to the underlying substrate as shown in FIG. 1C. The etching process is typically a dry etch using an appropriate etching chemistry. Suitable etching chemistries include, for example, plasma processing with $O_2$, $CHF_3$, $CF_4$, Ar, $SF_6$, and combinations thereof. Of these, oxygen and fluorinated plasma etching is typical. Optionally, the etching can include a trim etch to further reduce the width of the guide patterns for making finer patterns. The guide patterns typically have a width, for example, of from 1 to 30 nm and a center-to-center pitch of from 5 to 500 nm. This is typical, for example, for a pinning mat layer. If the application is for a neutral mat layer, the guide patterns typically have a width, for example, of from 5 to 300 nm and a center-to-center pitch of from 12 to 500 nm.

Figure 1D:
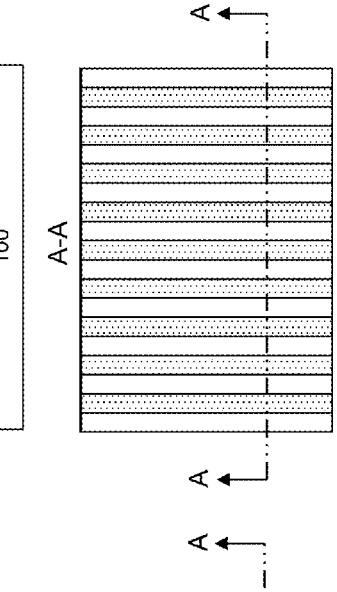

The remaining photoresist pattern 104 is removed from the substrate as shown in FIG. 1D using an appropriate stripper. Suitable strippers are commercially available and include, for example, ethyl lactate, gamma valerolactone, gamma butyrolactone or N-Methyl-2-pyrrolidone (NMP).

Figure 1E:
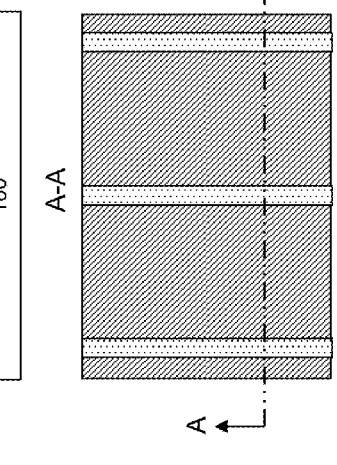

A brush composition is next coated over the substrate such that it is disposed in the recesses formed between the guide patterns to form brush layer 106, as shown in FIG. 1E. To allow for covalent bonding between the brush layer and substrate, the substrate typically has hydroxy groups bonded to the upper surface. Covalent bonding typically takes place by condensation reaction between the substrate hydroxy groups, for example, Si—OH (where the substrate includes $SiO_2$) or Ti—OH groups (where the substrate includes $TiO_2$), and those of the brush polymer. Covalent attachment of the brush polymer to the substrate is typically accomplished by, for example, spin-coating a solution of the brush polymer which comprises an attachment group having at least one hydroxy group as a terminal group of the polymer backbone or as a terminal group in a side chain of the polymer. It will be appreciated that additional or alternative techniques for bonding of the polymer may be used, for example, attachment via epoxy groups, ester groups, carboxylic acid groups, amide groups, siloxane groups, or (meth)acrylate groups, where these functional groups may also be present in the polymer or may be attached to the surface of the substrate by a surface treatment. The brush polymer is typically a random copolymer chosen, for example, from a hydroxyl-terminated poly(2-vinylpyridine), hydroxyl-terminated polystyrene-random-poly(methyl methacrylate), or may contain hydroxystyrene or 2-hydroxyethyl methacrylate units as a replacement of terminal hydroxy groups.

The brush composition layer is heated, thereby removing solvent and causing the polymer to become bonded to the substrate surface. Heating to bond the brush layer can be carried out at any suitable temperature and time, for example, with a temperature of from 70 to 250° C. and a time of from 30 seconds to 2 minutes being typical.

Figure 1F:
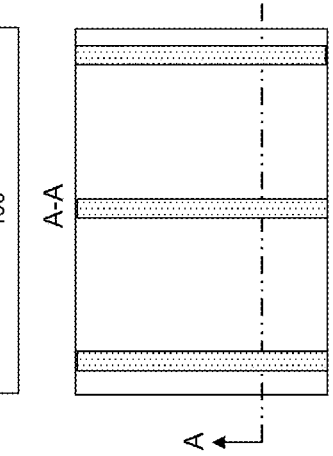
Figure 2C:
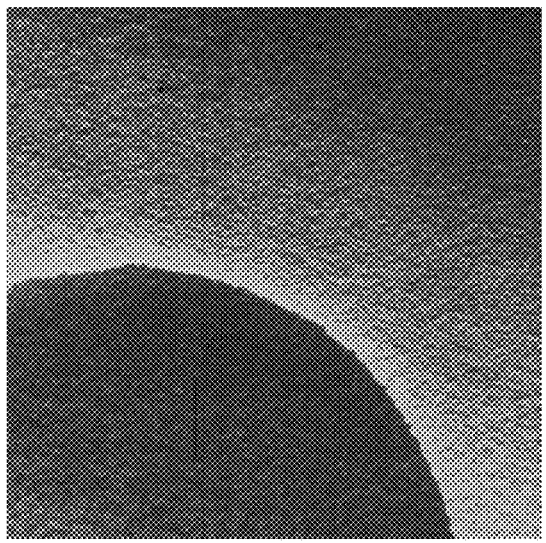
FIG. 2A-C are atomic force microscopy (AFM) images showing a self-aligned DSA layer on an underlayer composition of the invention.
Figure 2B:
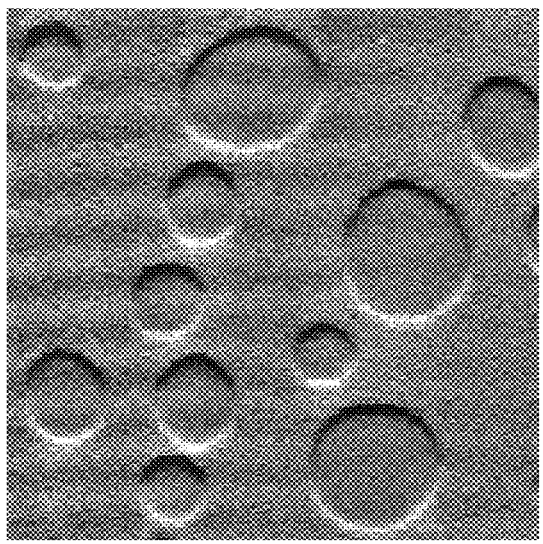
Figure 2A:
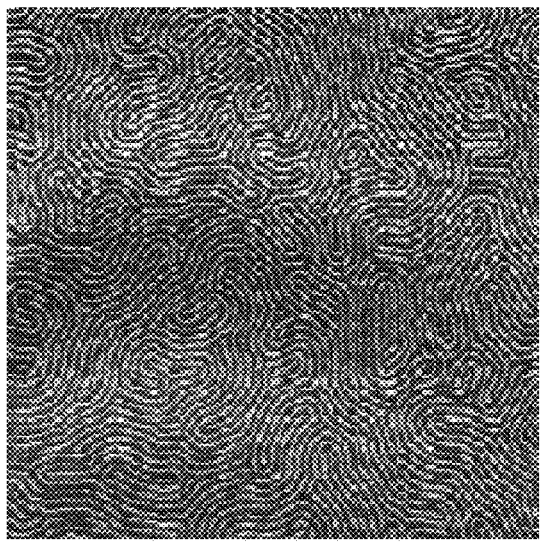

A directed self-assembling layer 108 is next formed over the brush layer 106 and guide patterns 102', as shown in FIG. 1F. The self-assembling layer comprises a block copolymer having a first block with an affinity for the underlayer guide patterns 102', and a second, dispersive (also referred to as "neutral") block without an affinity for the guide patterns. As used herein, "with an affinity for" means that the first block is surface-energy matched and attracted to the guide patterns, so that during casting and annealing, the mobile first block deposits selectively on and aligns to the guide patterns. In this way, the first block forms a first domain on the underlayer that is aligned to the guide patterns. Similarly, the second, dispersive block of the block copolymer, which has less affinity for the guide patterns of the underlayer, forms a second domain on the underlayer aligned adjacent to the first domain. The domains typically have a shortest average dimension of 1 to 100 nm, for example, from 5 to 75 nm or from 10 to 50 nm.

The blocks can in general be any appropriate domain-forming block to which another, dissimilar block can be attached. Blocks can be derived from different polymerizable monomers, where the blocks can include but are not limited to: polyolefins including polydienes, polyethers including poly(alkylene oxides) such as poly(ethylene oxide), poly(propylene oxide), poly(butylene oxide), or random or block copolymers of these; poly((meth)acrylates), polystyrenes, polyesters, polyorganosiloxanes, polyorganogermanes, or organometallic polymers prepared from polymerizable organometallic monomers based on Fe, Sn, Al, or Ti, such as poly(organophenylsilyl ferrocenes).

The blocks of the block copolymer can, for example, comprise as monomers $C_{2-30}$ olefinic monomers, (meth)acrylate monomers derived from $C_{1-30}$ alcohols, inorganic-containing monomers including those based on Fe, Si, Ge, Sn, Al, Ti, or a combination comprising at least one of the foregoing monomers. Exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or α-methylstyrene; and can include as (meth)acrylate monomers, methyl (meth)acrylate, ethyl (meth)acrylate, n-propyl (meth)acrylate, isopropyl (meth)acrylate, n-butyl (meth)acrylate, isobutyl (meth)acrylate, n-pentyl (meth)acrylate, isopentyl (meth)acrylate, neopentyl (meth)acrylate, n-hexyl (meth)acrylate, cyclohexyl (meth)acrylate, isobornyl (meth)acrylate, or hydroxyethyl (meth)acrylate. Combinations of two or more of these monomers can be used.

Useful block copolymers include at least two blocks, and may be diblock, triblock, tetrablock, etc. copolymers having discrete blocks. Exemplary block copolymers include polystyrene-b-polyvinyl pyridine, polystyrene-b-polybutadiene, polystyrene-b-polyisoprene, polystyrene-b-polymethyl methacrylate, polystyrene-b-polyalkenyl aromatics, polyisoprene-b-polyethylene oxide, polystyrene-b-poly(ethylene-propylene), polyethylene oxide-b-polycaprolactone, polybutadiene-b-polyethylene oxide, polystyrene-b-poly(t-butyl (meth)acrylate), polymethyl methacrylate-b-poly(t-butyl methacrylate), polyethylene oxide-b-polypropylene oxide, polystyrene-b-polytetrahydrofuran, polystyrene-b-polyisoprene-b-polyethylene oxide, poly(styrene-b-dimethylsiloxane), poly(methyl methacrylate-b-dimethylsiloxane), poly(methyl (meth)acrylate-r-styrene)-b-polymethyl methacrylate, poly(methyl (meth)acrylate-r-styrene)-b-polystyrene, poly(p-hydroxystyrene-r-styrene)-b-polymethyl methacrylate, poly(p-hydroxystyrene-r-styrene)-b-polyethylene oxide, polyisoprene-b-polystyrene-b-polyferrocenylsilane, or a combination comprising at least one of the foregoing block copolymers.

The block copolymer desirably has an overall molecular weight and polydispersity amenable to further processing. The block copolymer typically has a weight-averaged molecular weight (Mw) of 1,000 to 200,000 g/mol. The block copolymer typically has a polydispersity (Mw/Mn) of from 1.01 to 6, from 1.01 to 1.5, from 1.01 to 1.2 or from 1.01 to 1.1. Molecular weight, both Mw and Mn, can be determined by, for example, gel permeation chromatography using a universal calibration method, and calibrated to polystyrene standards.

The block copolymer is typically coated from a solution onto the underlayer (guide pattern and brush layer) surface by spin-coating to form a self-assembling layer 108 on the surface of the underlayer. The block copolymer is annealed to form the domains in an annealing process. The anneal conditions will depend on the particular material of the DSA layer. The anneal is typically conducted at a temperature of from 100 to 380° C. for a period of from 30 seconds to 2 hours. The anneal can be conducted at constant or variable temperature, for example, a moving gradient thermal heating to facilitate the formation of the desired self assembled morphology in the block copolymer. Another suitable annealing technique to facilitate formation of the desired self-assembled morphology in the block copolymer involves contacting the film with solvent vapor, either at ambient temperature or elevated temperature. The solvent vapor can, for example, be from a single solvent or from a blend of solvents. The composition of the solvent vapor can be varied over time. Solvent vapor annealing techniques are described, for example, in Jung and Ross, "Solvent-Vapor-Induced Tunability of Self-Assembled Block Copolymer Patterns," Adv. Mater., Vol. 21, Issue 24, pp. 2540-2545, Wiley-VCH, pp. 1521-4095 (2009) and U.S. Patent Pub. No. 2011/0272381.

The domains form where the first block forms a first domain 110 on the underlayer aligned to the guide patterns, and the second block forms a second domain 112 on the underlayer aligned adjacent to the first domain. Where the guide patterns of the underlayer form a sparse pattern spaced at an interval greater than an interval spacing of the first and second domains, additional first and second domains form on the underlayer to fill the interval spacing of the sparse pattern as illustrated. The additional first domains, without a guide pattern to align to, instead align to the previously formed second (dispersive) domain, and additional second domains align to the additional first domains.

A relief pattern is then formed by removing either the first or second domain and optionally the underlying portions of the underlayer. The step of removing can be accomplished, for example, by a wet etch method or a dry etch method, for example, with oxygen plasma, or a combination thereof.

The above methods and structures may be used in the manufacture of semiconductor devices including memory devices requiring dense line/space patterns such as dynamic random access memory (DRAM), synchronous dynamic random access memory (SDRAM) or dense features for data storage such as in hard drives. It will be appreciated that such devices are meant to be illustrative and should not be construed as limited thereto.

Further processing of the substrate is conducted to form a final device. The further processing can include, for example, one or more of formation of additional layers over the substrate, polishing, chemical-mechanical planarization (CMP), ion implantation, annealing, CVD, PVD, epitaxial growth, electroplating, etching and lithographic techniques such as DSA and photolithography.

The following non-limiting examples are illustrative of the invention.

EXAMPLES

Synthesis of 2-(1,2-dihydrocyclobutabenzen-1-yloxy)ethyl methacrylate 1-bromo-1,2-dihydrocyclobutabenzene (1.2)

To a round bottom neck flask, N-Bromosuccinimide (102 gram, 0.573 mole) and 600 ml chlorobenzene were added at room temperature. Benzoyl peroxide (1.2 gram, 0.005 mole) was next added, followed by bicyclo[4.2.0]octa-1(6),2,4-triene (1.1) (50 gram, 0.48 mole). The reaction mixture was stirred at 85° C. for 2 days. After cooling down to room temperature, 400 ml of heptane was added and the mixture was stirred at room temperature for 20 min. The mixture was filtered through a short pad of silica gel and washed with heptane. After concentrated under reduced pressure, the resulting oil was distilled at about 2 torr vacuum, 70-74° C., to give the product (1.2) as an oil (64 g, 73% yield).

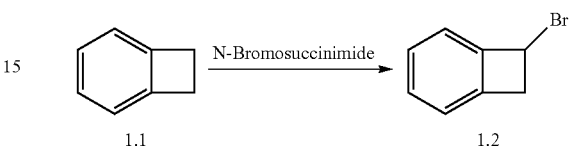

2-(1,2-dihydrocyclobutabenzen-1-yloxy)ethanol (1.3)

To a round bottom neck flask, 1-bromo-1,2-dihydrocyclobutabenzene (1.2) (30 gram, 0.164 mole) and ethylene glycol (150 ml) were added. Silver(I)tetrafluoroborate (35 gram, 0.18 mole) was next slowly added, while using ice bath to keep the temperature at about 30° C. After addition, the reaction mixture was stirred at 50° C. for 3 hrs. Once cooled down to room temperature, 200 ml of water and 400 ml of ether were added. The resulting mixture was filtered through celite. The organic layer was washed with water three times (each 300 ml) and then dried over $Na_2SO_4$ and concentrated to give the product (1.3) as an oil (21.8 g, yield 79%).

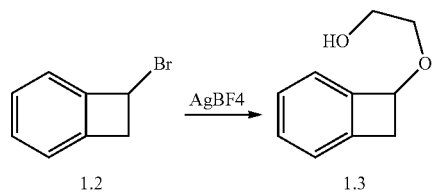

2-(1,2-dihydrocyclobutabenzen-1-yloxy)ethyl methacrylate (1.5)

2-(1,2-dihydrocyclobutabenzen-1-yloxy)ethanol (1.3) (20 gram, 0.122 mole) was dissolved in 500 ml of dichloromethane (DCM) with triethylamine (37 gram, 0.366 mole) and about 100 ppm butylated hydroxytoluene (BHT). The mixture was cooled down to about 0° C. with an ice bath. Then methacryloyl chloride (1.4) (15.27 gram, 0.146 mole) was added dropwise. The resulting mixture was stirred at about 0° C. for 4 hrs. After aqueous work-up, the organic phase was washed with 10% $NH_4OH$ and water. The organic phase was dried over $Na_2SO_4$ and concentrated. Flash chromatography was conducted with EA/Heptane 0-40% to give the desired product (1.5) (21 g, 74% yield).

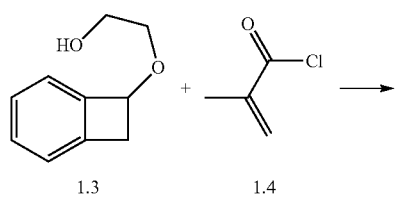

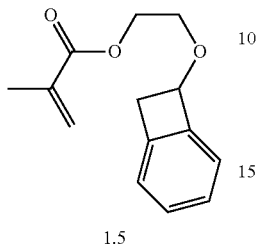

Preparation of Crosslinkable Polymers (CP)

Example 1

Crosslinkable Polymer 1 (CP1) (Comparative)

Styrene and 4-vinylbenzocyclobutene (VBCB) monomers were passed through an alumina column to remove all the inhibitors. 28.883 g of styrene, 1.116 g of VBCB, 0.225 g of N-tert-butyl-N-(2-methyl-1-phenylpropyl)-O-(1-phenylethyl)hydroxylamine, and 0.011 g of 2,2,5-Trimethyl-4-phenyl-3-azahexane-3-nitroxide were charged into a 100 mL Schlenk flask. The reaction mixture was degassed by three freeze-pump-thaw cycles and then the flask was charged with nitrogen and sealed. Subsequently, the reaction flask was heated at 120° C. for 19 hours. Precipitation was carried out in methanol/water (80/20). Precipitated polymers were collected by filtration, air-dried overnight, re-dissolved in THF, and re-precipitated into methanol/water (80/20). The final polymer was filtered, air-dried overnight and further dried under vacuum at 25° C. for 48 hours to give Crosslinkable Polymer 1 (CP1).

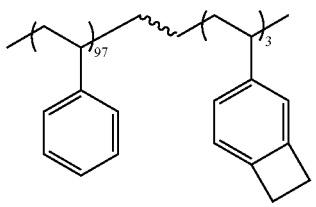

Example 2

Crosslinkable Polymer 2 (CP2) (Comparative)

Styrene and 4-vinylbenzocyclobutene (VBCB) monomers were passed through an alumina column to remove all the inhibitors. 26.341 g of styrene, 3.658 g of VBCB, 0.229 g of N-tert-butyl-N-(2-methyl-1-phenylpropyl)-O-(1-phenylethyl)hydroxylamine, and 0.011 g of 2,2,5-Trimethyl-4-phenyl-3-azahexane-3-nitroxide were charged into a 100 mL Schlenk flask. The reaction mixture was degassed by three freeze-pump-thaw cycles and then the flask was charged with nitrogen and sealed. Subsequently, the reaction flask was heated at 120° C. for 19 hours. Precipitation was carried out in methanol/water (80/20). Precipitated polymers were collected by filtration, air-dried overnight, re-dissolved in THF, and re-precipitated into methanol/water (80/20). The final polymer was filtered, air-dried overnight and further dried under vacuum at 25° C. for 48 hours to give Crosslinkable Polymer 2 (CP2).

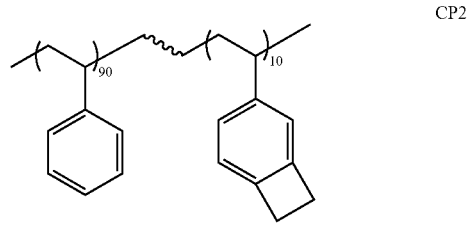

Example 3

Crosslinkable Polymer 3 (CP3)

17.899 g of styrene and 2.101 g of 2-(1,2-dihydrocyclobutabenzen-1-yloxy)ethyl methacrylate (BCBMA) were dissolved in 30.000 g of propylene glycol methyl ether acetate (PGMEA). The monomer solution was degassed by bubbling with nitrogen for 20 min. PGMEA (15.097 g) was charged into a 250 mL three-neck flask equipped with a condenser and a mechanical stirrer and was degassed by bubbling with nitrogen for 20 min. Subsequently, the solvent in the reaction flask was brought to a temperature of 80° C. V601 (dimethyl-2,2-azodiisobutyrate) (1.041 g) was dissolved in 4.000 g of PGMEA and the initiator solution was also degassed by bubbling with nitrogen for 20 min. The initiator solution was added into the reaction flask and then the monomer solution was fed into the reactor drop-wise over a 3 hour period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methanol/water (80/20). The precipitated polymer was collected by filtration, air-dried overnight, re-dissolved in THF, and re-precipitated into methanol/water (80/20). The final polymer was filtered, air-dried overnight and further dried under vacuum at 25° C. for 48 hours to give Crosslinkable Polymer 3 (CP3).

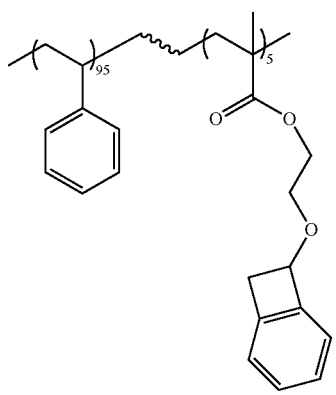

Example 4

Crosslinkable Polymer 4 (CP4)

16.028 g of styrene and 3.972 g of 2-(1,2-dihydrocyclobutabenzen-1-yloxy)ethyl methacrylate (BCBMA) were dissolved in 30.000 g of propylene glycol methyl ether acetate (PGMEA). The monomer solution was degassed by bubbling with nitrogen for 20 min. PGMEA (14.964 g) was charged into a 250 mL three-neck flask equipped with a condenser and a mechanical stirrer and was degassed by bubbling with nitrogen for 20 min. Subsequently, the solvent in the reaction flask was brought to a temperature of 80° C. V601 (dimethyl-2,2-azodiisobutyrate) (0.984 g) was dissolved in 4.000 g of PGMEA and the initiator solution was also degassed by bubbling with nitrogen for 20 min. The initiator solution was added into the reaction flask and then the monomer solution was fed into the reactor drop-wise over a 3 hour period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methanol/water (80/20). The precipitated polymer was collected by filtration, air-dried overnight, re-dissolved in THF, and re-precipitated into methanol/water (80/20). The final polymer was filtered, air-dried overnight and further dried under vacuum at 25° C. for 48 hours to give Crosslinkable Polymer 4 (CP4).

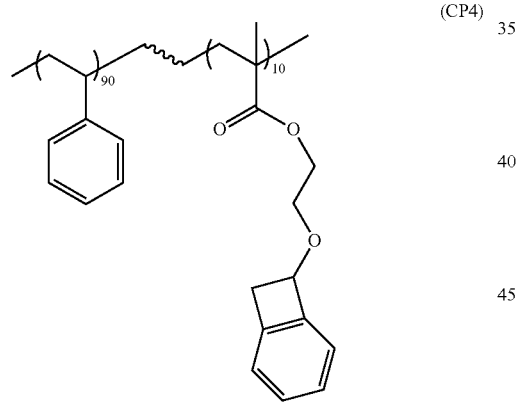

(CP4)

Example 5

Crosslinkable Polymer 5 (CP5)

15.901 g of methylmethacylate (MMA) and 4.099 g of 2-(1,2-dihydrocyclobutabenzen-1-yloxy)ethyl methacrylate (BCBMA) were dissolved in 30.000 g of propylene glycol methyl ether acetate (PGMEA). The monomer solution was degassed by bubbling with nitrogen for 20 min PGMEA (15.037 g) was charged into a 250 mL three-neck flask equipped with a condenser and a mechanical stirrer and was degassed by bubbling with nitrogen for 20 min. Subsequently, the solvent in the reaction flask was brought to a temperature of 80° C. V601 (dimethyl-2,2-azodiisobutyrate) (1.016 g) was dissolved in 4.000 g of PGMEA and the initiator solution was also degassed by bubbling with nitrogen for 20 min. The initiator solution was added into the reaction flask and then the monomer solution was fed into the reactor drop-wise over a 3 hour period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methanol/water (80/20). The precipitated polymer was collected by filtration, air-dried overnight, re-dissolved in THF, and re-precipitated into methanol/water (80/20). The final polymer was filtered, air-dried overnight and further dried under vacuum at 25° C. for 48 hours to give Crosslinkable Polymer 5 (CP5).

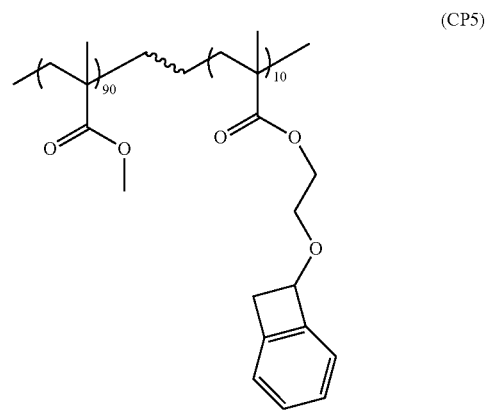

(CP5)

Example 6

Crosslinkable Polymer 6 (CP6)

17.445 g of benzylmethacylate (BZMA) and 2.555 g of 2-(1,2-dihydrocyclobutabenzen-1-yloxy)ethyl methacrylate (BCBMA) were dissolved in 30.000 g of propylene glycol methyl ether acetate (PGMEA). The monomer solution was degassed by bubbling with nitrogen for 20 min PGMEA (14.144 g) was charged into a 250 mL three-neck flask equipped with a condenser and a mechanical stirrer and was degassed by bubbling with nitrogen for 20 min. Subsequently, the solvent in the reaction flask was brought to a temperature of 80° C. V601 (dimethyl-2,2-azodiisobutyrate) (0.633 g) was dissolved in 4.000 g of PGMEA and the initiator solution was also degassed by bubbling with nitrogen for 20 min. The initiator solution was added into the reaction flask and then the monomer solution was fed into the reactor drop-wise over a 3 hour period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methanol/water (80/20). The precipitated polymer was collected by filtration, air-dried overnight, re-dissolved in THF, and re-precipitated into methanol/water (80/20). The final polymer was filtered, air-dried overnight and further dried under vacuum at 25° C. for 48 hours to give Crosslinkable Polymer 6 (CP6).

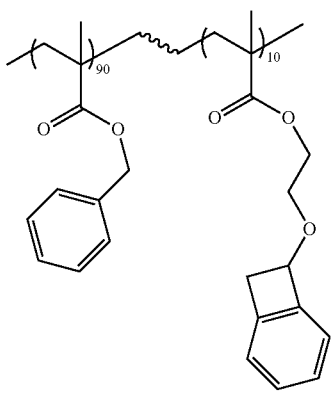

(CP6)

Example 7

Crosslinkable Polymer 7 (CP7)

17.254 g of phenylmethacylate (PHMA) and 2.746 g of 2-(1,2-dihydrocyclobutabenzen-1-yloxy)ethyl methacrylate (BCBMA) were dissolved in 30.000 g of propylene glycol methyl ether acetate (PGMEA). The monomer solution was degassed by bubbling with nitrogen for 20 min PGMEA (14.254 g) was charged into a 250 mL three-neck flask equipped with a condenser and a mechanical stirrer and was degassed by bubbling with nitrogen for 20 min. Subsequently, the solvent in the reaction flask was brought to a temperature of 80° C. V601 (dimethyl-2,2-azodiisobutyrate) (0.680 g) was dissolved in 4.000 g of PGMEA and the initiator solution was also degassed by bubbling with nitrogen for 20 min. The initiator solution was added into the reaction flask and then the monomer solution was fed into the reactor drop-wise over a 3 hour period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methanol/water (80/20). The precipitated polymer was collected by filtration, air-dried overnight, re-dissolved in THF, and re-precipitated into methanol/water (80/20). The final polymer was filtered, air-dried overnight and further dried under vacuum at 25° C. for 48 hours to give Crosslinkable Polymer 7 (CP7).

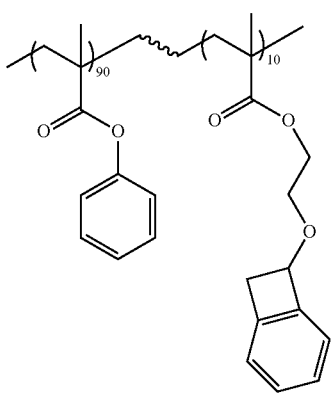

(CP7)

Example 8

Crosslinkable Polymer 8 (CP8)

16.415 g of 4-methylstyrene (4MS), 3.585 g of 2-(1,2-dihydrocyclobutabenzen-1-yloxy)ethyl methacrylate (BCBMA) and 0.178 g of V601 (dimethyl-2,2-azodiisobutyrate) were dissolved in 20.000 g of propylene glycol methyl ether acetate (PGMEA) and were charged into a 250 mL three-neck flask equipped with a condenser and a mechanical stirrer. The monomer solution was degassed by bubbling with nitrogen for 20 min. Subsequently, the reaction solution was brought to a temperature of 60° C. After 24 hours of polymerization, the reaction mixture was allowed to cool down to room temperature. Precipitation was carried out in methanol/water (80/20). The precipitated polymer was collected by filtration, air-dried overnight, re-dissolved in THF, and re-precipitated into methanol/water (80/20). The final polymer was filtered, air-dried overnight and further dried under vacuum at 25° C. for 48 hours to give Crosslinkable Polymer 8 (CP8).

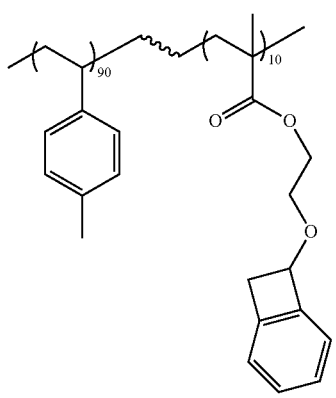

(CP8)

Example 9

Crosslinkable Polymer 9 (CP9)

18.125 g of 4-methylstyrene (4MS), 1.875 g of 2-(1,2-dihydrocyclobutabenzen-1-yloxy)ethyl methacrylate (BCBMA) and 0.130 g of V601 (dimethyl-2,2-azodiisobutyrate) were dissolved in 20.000 g of propylene glycol methyl ether acetate (PGMEA) and were charged into a 250 mL three-neck flask equipped with a condenser and a mechanical stirrer. The monomer solution was degassed by bubbling with nitrogen for 20 min. Subsequently, the reaction solution was brought to a temperature of 60° C. After 24 hours of polymerization, the reaction mixture was allowed to cool down to room temperature. Precipitation was carried out in methanol/water (80/20). The precipitated polymer was collected by filtration, air-dried overnight, re-dissolved in THF, and re-precipitated into methanol/water (80/20). The final polymer was filtered, air-dried overnight and further dried under vacuum at 25° C. for 48 hours to give Crosslinkable Polymer 9 (CP9).

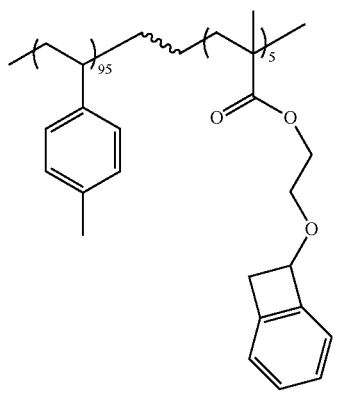

(CP9)

Example 10

Crosslinkable Polymer 10 (CP10)

18.258 g of n-propylmethacrylate (nPMA), 1.742 g of 2-(1,2-dihydrocyclobutabenzen-1-yloxy)ethyl methacrylate (BCBMA) and 0.121 g of V601 (dimethyl-2,2-azodiisobutyrate) were dissolved in 20.000 g of propylene glycol methyl ether acetate (PGMEA) and were charged into a 250 mL three-neck flask equipped with a condenser and a mechanical stirrer. The monomer solution was degassed by bubbling with nitrogen for 20 min. Subsequently, the reaction solution was brought to a temperature of 60° C. After 24 hours of polymerization, the reaction mixture was allowed to cool down to room temperature. Precipitation was carried out in methanol/water (80/20). The precipitated polymer was collected by filtration, air-dried overnight, re-dissolved in THF, and re-precipitated into methanol/water (80/20). The final polymer was filtered, air-dried overnight and further dried under vacuum at 25° C. for 48 hours to give Crosslinkable Polymer 10 (CP10).

(CP10)

Solvent Strip Test

Thermal cross-linking reactions for the crosslinkable polymers were indirectly monitored by performing a solvent strip test. Each of the crosslinkable polymers prepared in Examples 1 to 10 was dissolved in propylene glycol methyl ether acetate (PGMEA) and spin-coated on a bare Si wafer. The coated wafers were heated under nitrogen environment at various temperatures and for different periods of time as shown in Table 1 to investigate the effectiveness of thermal crosslinking. Subsequently, the films were thoroughly rinsed with PGMEA to remove uncrosslinked material. The thickness of the insoluble crosslinked polymer remaining on the substrate was measured. The results are shown below Table 1.

TABLE 1

| Crosslinkable Polymer | Annealing Temperature (° C.) | Annealing Time (min) | Thickness Before Solvent Strip (nm) | Thickness After Solvent Strip (nm) | Solvent Strip Test (Pass or Fail) |
|---|---|---|---|---|---|
| CP1 (Comp) | 200 | 2 | 39.3 | <10.0 | Fail |
| | 200 | 5 | 40.7 | <10.0 | Fail |
| | 200 | 10 | 41.8 | <10.0 | Fail |
| | 200 | 30 | 41.6 | <10.0 | Fail |
| | 250 | 2 | 42.7 | 18.5 | Fail |
| | 250 | 5 | 41.8 | 22.5 | Fail |
| | 250 | 10 | 42.5 | 27.6 | Fail |
| | 250 | 30 | 42.4 | 42.3 | Pass |
| CP2 (Comp) | 200 | 2 | 43.4 | <10.0 | Fail |
| | 200 | 5 | 44.0 | <10.0 | Fail |
| | 200 | 10 | 43.6 | <10.0 | Fail |
| | 200 | 30 | 41.3 | <10.0 | Fail |
| | 250 | 2 | 42.1 | 18.3 | Fail |
| | 250 | 5 | 40.9 | 41.1 | Pass |
| | 250 | 10 | 41.2 | 39.6 | Pass |
| | 250 | 30 | 42.2 | 39.0 | Pass |
| CP3 | 150 | 2 | 35.0 | 2.6 | Fail |
| | 180 | 2 | 35.0 | 5.5 | Fail |
| | 200 | 2 | 35.0 | 27.8 | Fail |
| | 220 | 2 | 35.0 | 34.7 | Pass |
| | 250 | 2 | 35.0 | 35.0 | Pass |
| CP4 | 150 | 2 | 55.5 | 38.2 | Fail |
| | 180 | 2 | 55.8 | 54.2 | Pass |
| | 200 | 2 | 55.1 | 54.4 | Pass |
| | 220 | 2 | 54.9 | 54.5 | Pass |
| | 250 | 2 | 52.8 | 51.1 | Pass |
| CP5 | 150 | 2 | 52.6 | 38.0 | Fail |
| | 180 | 2 | 51.4 | 52.0 | Pass |
| | 200 | 2 | 50.6 | 50.9 | Pass |
| | 220 | 2 | 50.1 | 50.2 | Pass |
| | 250 | 2 | 47.5 | 47.7 | Pass |
| CP6 | 150 | 2 | 50.8 | 35.8 | Fail |
| | 180 | 2 | 49.6 | 46.7 | Pass |
| | 200 | 2 | 49.8 | 47.9 | Pass |
| | 220 | 2 | 48.2 | 47.1 | Pass |
| | 250 | 2 | 47.4 | 46.4 | Pass |
| CP7 | 150 | 2 | 48.6 | 16.3 | Fail |
| | 180 | 2 | 47.3 | 39.9 | Fail |
| | 200 | 2 | 45.3 | 44.5 | Pass |
| | 220 | 2 | 46.2 | 46.1 | Pass |
| | 250 | 2 | 45.6 | 45.8 | Pass |
| CP8 | 200 | 2 | 8.4 | 8.2 | Pass |
| | 220 | 2 | 8.3 | 8.1 | Pass |
| | 250 | 2 | 8.1 | 8.3 | Pass |
| CP9 | 150 | 2 | 43.4 | 4.0 | Fail |
| | 180 | 2 | 43.4 | 37.3 | Fail |
| | 200 | 2 | 43.1 | 42.4 | Pass |
| | 220 | 2 | 43.0 | 43.2 | Pass |
| | 250 | 2 | 42.9 | 43.2 | Pass |
| CP10 | 150 | 2 | 58.0 | 56.6 | Pass |
| | 180 | 2 | 54.9 | 55.3 | Pass |
| | 200 | 2 | 51.9 | 51.9 | Pass |
| | 220 | 2 | 50.6 | 50.6 | Pass |
| | 250 | 2 | 45.1 | 44.7 | Pass |

Table 1 shows that effective crosslinking for the Comparative Crosslinkable Polymers 1 and 2 was achieved only when annealed at high temperature, such as at 250° C. for 30 minutes for CP1 and 250° C. for 5 minutes for CP2. Effective crosslinking for each of Crosslinkable Polymers 3-10 of the invention was achieved with annealing at lower temperatures and shorter times.

Block Copolymer Self-Assemblies on Crosslinked Underlayers

Crosslinkable underlayer compositions were prepared by dissolving each of crosslinkable polymers CP4, CP5 and CP8 in PGMEA. The resulting compositions were spin-coated on respective silicon wafers to form underlayers having a thickness of 8 to 9 nm. The underlayers were annealed to induce crosslinking at the conditions shown below in Table 2. A DSA composition including polystyrene-block-polymethylmethacrylate (PS-b-PMMA) block copolymer in PGMEA was coated over the underlayers to a thickness of 32 nm for CP4 and CP5 and 50 nm for CP8, and annealed at 250° C. for 2 minutes. Atomic force microscopy (AFM) imaging was performed on the resulting wafers to observe the patterns formed on the surface. The resulting AFM image for Polymer CP4 was a fingerprint pattern, indicating a neutral underlayer to both polystyrene and polymethylmethacrylate blocks of the DSA polymer. The AFM images for Polymer CP5 and CP8 were polymethylmethacrylate-preferential and polystyrene-preferential island/hole patterns, respectively. These results indicate that the surface energy of underlayer compositions can be tuned to preferentially different blocks of the DSA block copolymer or to be neutral to both blocks.

TABLE 2

| Polymer | Anneal Temp (° C.) | Anneal Time (min) | Anneal Ambient | Wetting Preference |
|---|---|---|---|---|
| CP4 | 200 | 2 | Air | Neutral |
| CP5 | 200 | 2 | Air | PMMA |
| CP8 | 250 | 2 | nitrogen | PS |

What is claimed is:

1. A method of forming a pattern by directed self-assembly, comprising:
   (a) providing a semiconductor substrate comprising one or more layers to be patterned;
   (b) applying a crosslinkable underlayer composition over the one or more layers to be patterned to form a crosslinkable underlayer, wherein the crosslinkable underlayer composition comprises a crosslinkable polymer comprising a first unit formed from a monomer of the following general formula (I-A) or (I-B):

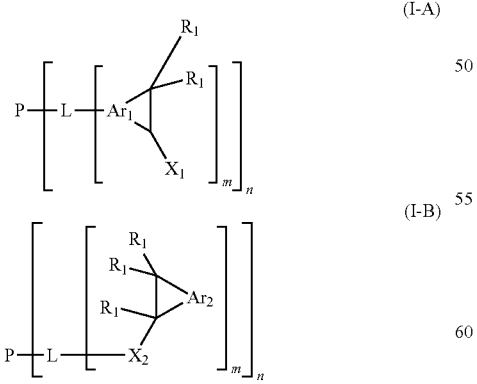

wherein: P is a polymerizable functional group; L is a single bond or an m+1-valent linking group; $X_1$ is a monovalent electron donating group; $X_2$ is a divalent electron donating group; $Ar_1$ and $Ar_2$ are trivalent and divalent aryl groups, respectively, and carbon atoms of the cyclobutene ring are bonded to adjacent carbon atoms on the same aromatic ring of $Ar_1$ or $Ar_2$; m and n are each an integer of 1 or more; and each $R_1$ is independently a monovalent group; wherein the first unit is present in the crosslinkable polymer in an amount of from 3 to 10 mol %, based on the polymer;
   (c) heating the crosslinkable underlayer to form a crosslinked underlayer;
   (d) patterning the crosslinked underlayer;
   (e) forming a self-assembling layer comprising a block copolymer over the patterned crosslinked underlayer; and
   (f) annealing the self-assembling layer.

2. The method of claim 1, wherein the patterned crosslinked underlayer is formed by photolithography and etching, wherein recesses exposing the substrate are disposed between adjacent patterns of the crosslinked underlayer.

3. The method of claim 2, further comprising forming a brush layer in the recesses between adjacent patterns, wherein the self-assembling layer is formed on the patterns and the brush layer.

4. The method of claim 1, wherein the patterns are formed by chemically altering selected regions of the crosslinked underlayer.

5. The method of claim 1, wherein the polymerizable functional group P is chosen from the following general formulae (II-A) and (II-B):

wherein $R_4$ is chosen from hydrogen, fluorine, $C_1$-$C_3$ alkyl and $C_1$-$C_3$ fluoroalkyl; and A is oxygen or is represented by the formula $NR_5$, wherein $R_5$ is chosen from hydrogen and substituted and unsubstituted $C_1$ to $C_{10}$ linear, branched and cyclic hydrocarbons; and

wherein $R_6$ is chosen from hydrogen, fluorine, $C_1$-$C_3$ alkyl and $C_1$-$C_3$ fluoroalkyl; and wherein L is chosen from optionally substituted linear or branched aliphatic and aromatic hydrocarbons, and combinations thereof, optionally with one or more linking moiety chosen from —O—, —S—, —COO—, —CONR$_3$—, —CONH— and —OCONH—, wherein $R_3$ is chosen from hydrogen and substituted and unsubstituted $C_1$ to $C_{10}$ linear, branched and cyclic hydrocarbons.

6. The method of claim 1, wherein the first unit is formed from a monomer of the general formula (I-A), wherein $X_1$ is chosen from $C_1$-$C_{10}$ alkoxy, amine, sulfur, —OCOR$_9$, wherein $R_9$ is chosen from substituted and unsubstituted $C_1$ to $C_{10}$ linear, branched and cyclic hydrocarbons, —NH- COR₁₀, wherein R₁₀ is chosen from substituted and unsubstituted C₁ to C₁₀ linear, branched and cyclic hydrocarbons, and combinations thereof.

7. The method of claim 1, wherein the first unit is formed from a monomer of the general formula (I-B), wherein X₂ is —O—, —S—, —COO—, —CONR₁₁—, —CONH— and —OCONH—, wherein R₁₁ is chosen from hydrogen and substituted and unsubstituted C₁ to C₁₀ linear, branched and cyclic hydrocarbons, and combinations thereof.

8. The method of claim 1, wherein the first unit is formed from a monomer chosen from one or more of the following monomers:

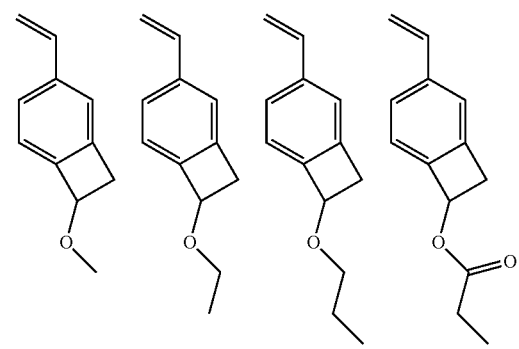
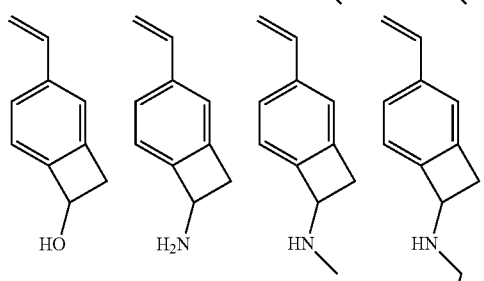
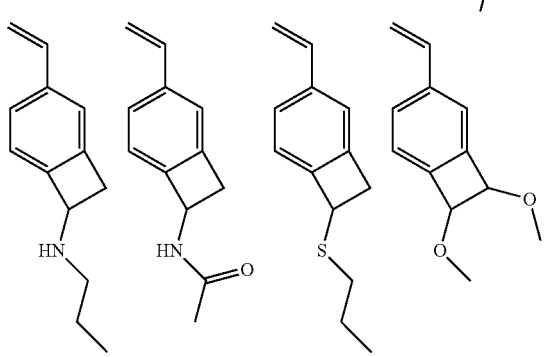
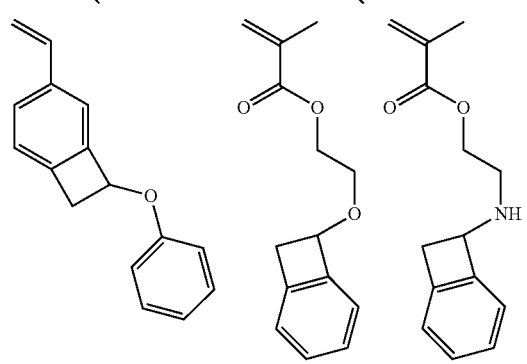

-continued

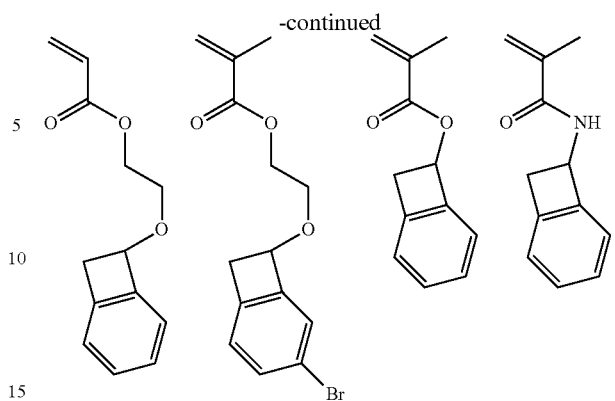
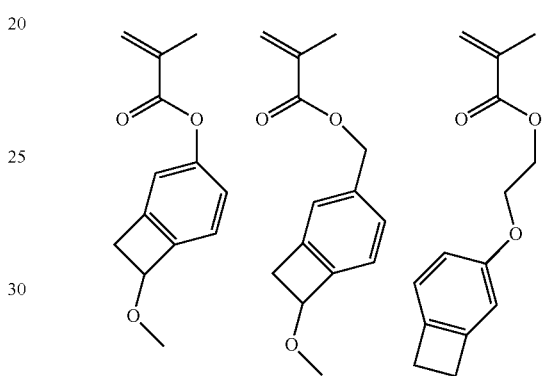
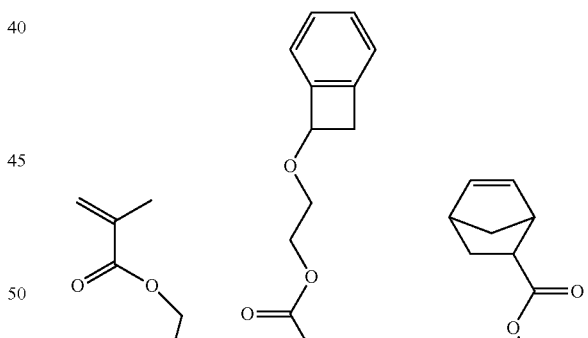
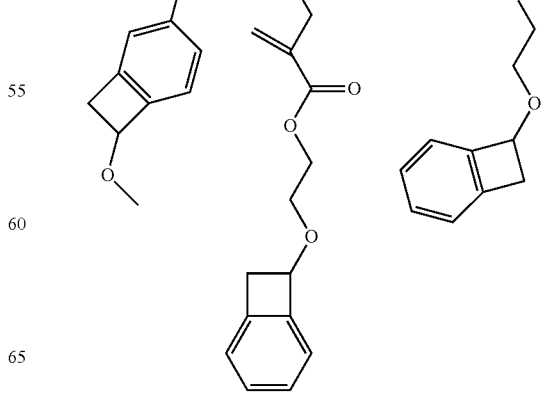

-continued
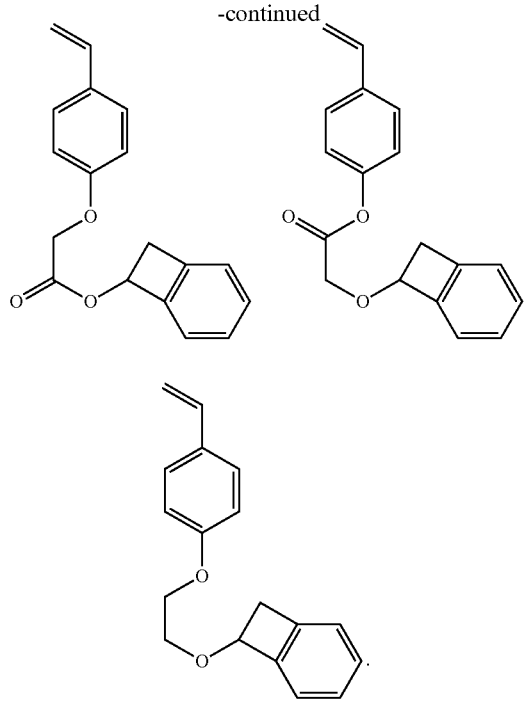
9. The method of claim 1, wherein the polymer further comprises a second unit chosen from general formulae (III) and (IV):
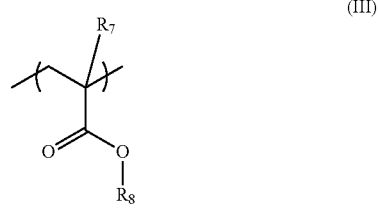
(III)
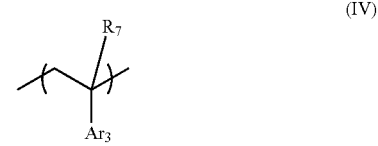
(IV)
wherein $R_7$ is chosen from hydrogen, fluorine, $C_1$-$C_3$ alkyl and $C_1$-$C_3$ fluoroalkyl, $R_8$ is chosen from optionally substituted $C_1$ to $C_{10}$ alkyl, and $Ar_3$ is an optionally substituted aryl group.
* * * * *